(12) United States Patent
Harper et al.

(10) Patent No.: US 8,943,377 B2
(45) Date of Patent: Jan. 27, 2015

(54) ON-CHIP DETECTION OF TYPES OF OPERATIONS TESTED BY AN LBIST

(75) Inventors: Michael W. Harper, Round Rock, TX (US); Mack W. Riley, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 13/586,227

(22) Filed: Aug. 15, 2012

(65) Prior Publication Data

US 2014/0053034 A1    Feb. 20, 2014

(51) Int. Cl.
*G01R 31/28* (2006.01)
*G11C 29/00* (2006.01)
*G06F 11/00* (2006.01)
(Continued)

(52) U.S. Cl.
CPC .... *G01R 31/3177* (2013.01); *G01R 31/318533* (2013.01); *G01R 31/318544* (2013.01); *G01R 31/318566* (2013.01); *G01R 31/3187* (2013.01); *G01R 31/317* (2013.01); *G01R 31/31724* (2013.01); *G01R 31/318555* (2013.01); *G01R 31/2856* (2013.01); *G01R 31/2851* (2013.01); *G06F 11/27* (2013.01); *G06F 11/25* (2013.01); *G06F 11/3003* (2013.01);
(Continued)

(58) Field of Classification Search
CPC ................... G01R 31/3177; G01R 31/318533; G01R 31/318544; G01R 31/318566; G01R 31/3187; G01R 31/317; G01R 31/31724; G01R 31/318555; G01R 31/2851; G01R 31/2856; G06F 11/25; G06F 11/27; G06F 11/3003; G06F 11/3065; G06F 11/3089; G06F 11/3466

USPC ......... 714/729, 728, 733, 742, 724, 735, 736, 714/718, 719
See application file for complete search history.

(56) References Cited

U.S. PATENT DOCUMENTS 6,178,534 B1    1/2001 Day et al.
6,327,685 B1    12/2001 Koprowski et al.
(Continued)

FOREIGN PATENT DOCUMENTS

EP    1241678 A2    9/2002
KR    2007117715 A    12/2007

OTHER PUBLICATIONS

Li Chen et al, "Embedded hardware and software self-testing methodologies for processor cores", Dept. of ECE, University of California at San Diego, La Jolla, CA 92093, 2000, pp. 625-630, 6 pages.
(Continued)

*Primary Examiner* — John J Tabone, Jr.
(74) *Attorney, Agent, or Firm* — Steven L. Bennett; Amy J. Pattillo

(57) ABSTRACT

An integrated circuit includes an LBIST controller operative to run a test program on at least one selection of core logic of the integrated circuit to test the operability of the at least one selection of core logic. The integrated circuit also includes a monitoring logic structure operative to detect at least one type of operation executed for the test program from at least one particular control signal activated by the LBIST controller for controlling the at least one selection of core logic to execute the test program from among at least one control signal for controlling operations on the at least one selection of core logic.

10 Claims, 7 Drawing Sheets

(51) Int. Cl.
  *G01R 31/3177* (2006.01)
  *G01R 31/3185* (2006.01)
  *G01R 31/3187* (2006.01)
  *G01R 31/317* (2006.01)
  *G06F 11/27* (2006.01)
  *G06F 11/25* (2006.01)
  *G06F 11/30* (2006.01)
  *G06F 11/34* (2006.01)
  *G11C 29/12* (2006.01)

(52) U.S. Cl.
  CPC ....... *G06F 11/3065* (2013.01); *G06F 11/3089* (2013.01); *G06F 11/3466* (2013.01); *G11C 29/12* (2013.01)
  USPC ........... 714/729; 714/718; 714/719; 714/728; 714/733; 714/735; 714/736; 714/742; 714/724

(56) References Cited

U.S. PATENT DOCUMENTS

| | | | |
|---|---|---|---|
| 6,546,503 B2 * | 4/2003 | Ooishi | 714/6.2 |
| 6,901,546 B2 | 5/2005 | Chu et al. | |
| 6,996,032 B2 * | 2/2006 | Ganry | 368/118 |
| 7,099,783 B2 * | 8/2006 | Hasegawa et al. | 702/57 |
| 7,475,311 B2 | 1/2009 | Kiryu | |
| 7,715,264 B2 * | 5/2010 | Meyer et al. | 365/222 |
| 7,716,546 B2 | 5/2010 | Le et al. | |
| 7,962,821 B2 * | 6/2011 | Tokunaga et al. | 714/733 |
| 8,595,557 B2 * | 11/2013 | Jasinski et al. | 714/36 |
| 2004/0230882 A1 | 11/2004 | Huott et al. | |
| 2006/0221842 A1 | 10/2006 | Terry | |
| 2007/0011537 A1 | 1/2007 | Kiryu | |
| 2008/0022176 A1 | 1/2008 | Anzou et al. | |
| 2008/0082884 A1 * | 4/2008 | Harada | 714/733 |
| 2008/0276144 A1 | 11/2008 | Huben et al. | |
| 2009/0089636 A1 | 4/2009 | Fernsler et al. | |
| 2009/0094496 A1 | 4/2009 | Le et al. | |
| 2011/0087453 A1 * | 4/2011 | Selva et al. | 702/117 |
| 2012/0124440 A1 * | 5/2012 | Gorti et al. | 714/733 |
| 2012/0226942 A1 * | 9/2012 | Gangasani et al. | 714/30 |
| 2014/0053035 A1 * | 2/2014 | Harper et al. | 714/733 |

OTHER PUBLICATIONS

U.S. Appl. No. 14/060,175, filed Oct. 22, 2013, in re Harper, International Business Machines Corporation, 42 pages.

* cited by examiner

US 8,943,377 B2

ON-CHIP DETECTION OF TYPES OF OPERATIONS TESTED BY AN LBIST

BACKGROUND

1. Technical Field

The embodiment of the invention relates generally to testing an integrated circuit and more particularly to on-chip detection of the types of operations run by an LBIST on an integrated circuit for a test program.

2. Description of Related Art

Modern electronic devices, such as microprocessors, often include a matrix of logic gates arranged to perform particular tasks and functions. These logic gates are often interconnected in two parallel arrangements, one arrangement for normal operation, and another arrangement for testing circuit functionality. Coupling multiple latches together into a scan chain is one method of arranging logic units for both operational and testing functionality.

One example of the circuitry included on-chip for an integrated circuit to test its own functionality is referred to as a Logic Built-In Self Test (LBIST). In a lab environment and in a manufacturing environment, LBIST is a test mechanism that generates pseudo-random test data to apply to scan chains within the integrated circuit and outputs the results of the test data applied to the scan chains. A test program specifies one or more types of operations for the LBIST to execute on the test data through the scan chains.

A test program is considered as passing when, after the test program is executed, the output of the scan chains in a register matches an expected output from the scan chains. There are circumstances that can occur, however, that allow the test program to pass because the output of the scan chains in the register matches an expected output from the scan chains, but where the test program includes operations that were inadvertently added and not desired or where the test program does not run all the desired operations. For example, a user may intend to run an LBIST test program that only includes operations for functional cycles, but a typographical error introduced during programming could result in the test program also executing a scan only sequence. In another example, a user may run an LBIST test program that includes operations for scan cycles, a force update for non-scan latches, and functional cycles, but the LBIST controller may not execute the operations for the force update for non-scan latches. In these examples, while the LBIST controller does not execute the expected operations for a test program, the output of the scan chains may still match the expected output from the scan chains and the test program would pass.

BRIEF SUMMARY

Therefore, in view of the foregoing, there is a need for a method, system, and computer program product for monitoring the control signals output by an LBIST controller for execution of a test program and for detecting, on chip, the types of operations that actually occur during the execution of a test program by the LBIST controller. In one embodiment, an integrated circuit includes a Logic Built-in Self-Test (LBIST) structure operative to run a test program on at least one selection of core logic of the integrated circuit to test the operability of the at least one selection of core logic the LBIST structure positioned on chip with the at least one selection of core logic, the test program specifying at least one operation for the LBIST structure to run on at least one test pattern through the at least one selection of core logic, the at least one operation comprising at least one type of operation of a plurality of types of operations. The LBIST structure is also operative to control the at least one type of operation of the plurality of types of operations performed on the at least one selection of core logic, while running the at least one operation of the test program, by activating at least one control signal of a plurality of control signals received as inputs to the at least one selection of core logic, wherein one or more control signals of the plurality of control signals is associated with each type of operation of the plurality of types of operations. The LBIST structure also includes a monitoring logic structure operative to detect the at least one type of operation actually performed on the at least one selection of core logic while executed for the test program is running by monitoring the at least one control signal of the plurality of control signals activated by the LBIST structure while the LBIST structure runs the test program.

BRIEF DESCRIPTION OF THE SEVERAL VIEWS OF THE DRAWINGS

The novel features believed characteristic of one or more embodiments of the invention are set forth in the appended claims. The one or more embodiments of the invention itself however, will best be understood by reference to the following detailed description of an illustrative embodiment when read in conjunction with the accompanying drawings, wherein:

DETAILED DESCRIPTION

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

In addition, in the following description, for purposes of explanation, numerous systems are described. It is important to note, and it will be apparent to one skilled in the art, that the present invention may execute in a variety of systems, including a variety of computer systems and electronic devices operating any number of different types of operating systems.

Figure 1:
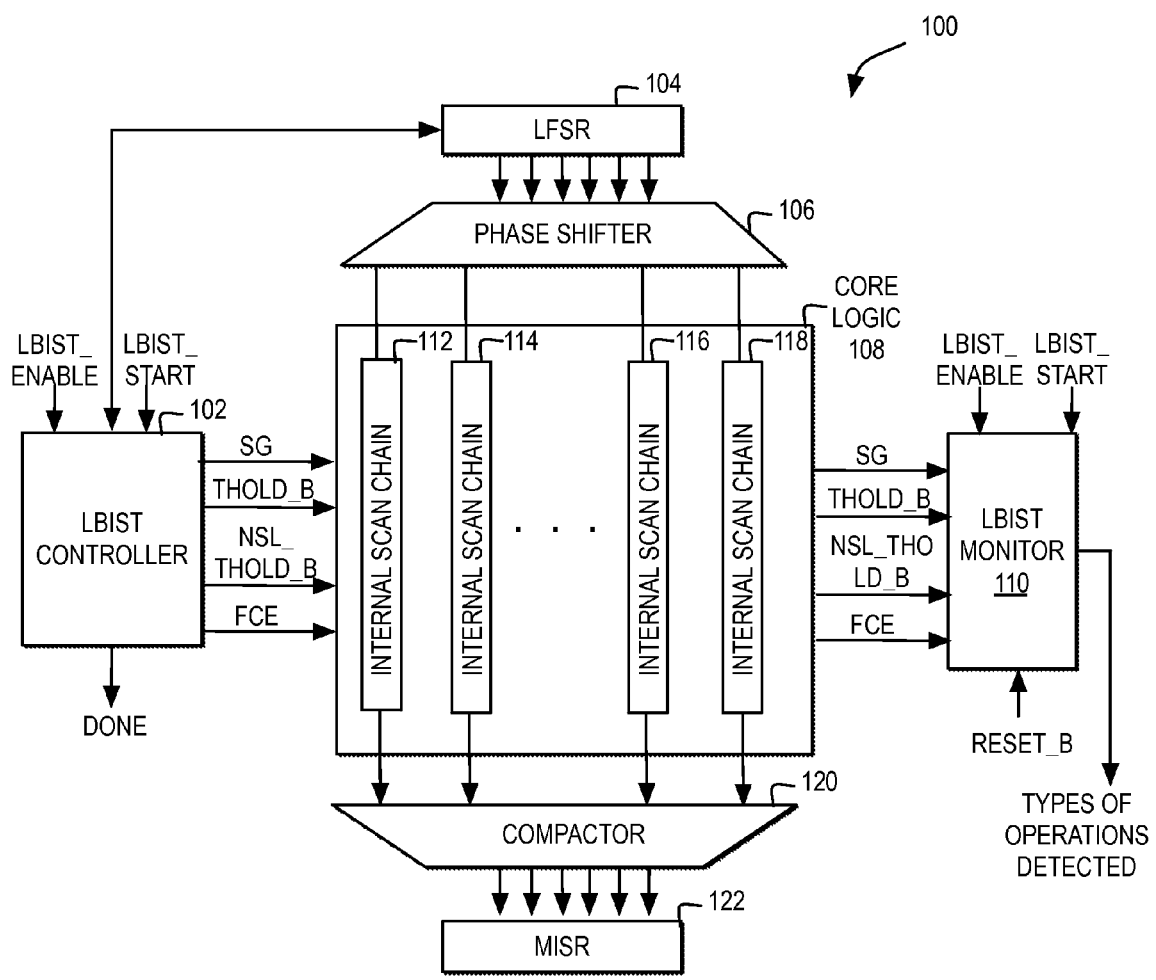
FIG. 1 illustrates a block diagram of one example of an LBIST controller, including an LBIST monitor, within a processor.

FIG. 1 illustrates a block diagram of one example of an LBIST controller, including an LBIST monitor, within a processor. In the example, a processor 100, an example of an integrated circuit, includes core logic 108. Processor 100 may be implemented within a computer system, for example as processor 712 in computer system 700 in FIG. 7. The components illustrates within processor 100 are provided for purposes of illustration. It will be apparent to one skilled in the art that processor 100 may include additional or alternate components in additional or alternate configurations to the components and configurations of components illustrated herein.

Core logic 108 represents a structure on processor 100 that includes one or more internal scan chains, such as internal scan chains 112, 114, 116, and 118 in the illustrated example, which maybe physical distributed throughout processor 100 in one or more types of configurations. Each of internal scan chains 112, 114, 116, and 118 represents a coupling of one or more linked logic units. In one example, each of internal scan chains 112, 114, 116, and 118 may represent one scan chain partitioned into sub-chains of approximately the same length. In another example, each of internal scan chains 112, 114, 116, and 118 may each represent a scan chain that is further partitioned into sub-chains.

The components within processor 100 are arranged for both normal operation and testing operation. For testing the functionality of core logic 108, processor 100 includes at least one LBIST structure implemented through one or more of an LBIST controller 102, a Linear Feedback Shift Register (LFSR) 104, a phase shifter 106, a compactor 120, a Multiple Input Signature Register (MISR) 122, and an LBIST monitor 110. Processor 100 may include one or more instances of an LBIST structure in one or more configurations and each LBIST structure or a combination of one more components of an LBIST structure may test one or more instances of core logic 108 within one or more processor cores.

In one example, an LBIST logic structure includes LBIST controller 102 to control outputs to one or more other components within processor 100 and to control or work with the clocking mechanisms of processor 100 to control scanning and functional operations within core logic 108. In one example, when LBIST controller 102 detects an active LBIST_enable signal, LBIST controller 102 operates in a testing mode. In the example, the setting of the LBIST_enable signal indicates whether processor 100 is operating in an LBIST testing mode or a normal operation mode. In addition, in one example, when LBIST controller 102 detects an active LBIST_start signal, LBIST controller 102 activates LFSR 104, core logic 108, MISR 122, and other components and runs a test program on processor 100. In the example, the setting of the LBIST_start signal indicates whether the LBIST function is operating. As described herein, the test program run by LBIST controller 102 may be referred to as a test program or as an LBIST test program.

In the example, when the LBIST_start control signal is activated, for each operation or sequence of operations in a test program, LBIST controller 102 triggers LFSR 104 to generate a test pattern, pass the test pattern through phase shifter 106, and load the test pattern into internal scan chains 112, 114, 116, and 118. For each operation in the test program, LBIST controller 102 triggers compactor 120 to unload results from internal scan chains 112, 114, 116, and 118 into MISR 122. In the example, LFSR 104 and phase shifter 106 operate as a pseudo random pattern generator that generates and provides pseudo random data as the test stimuli for each test pattern. In the example, the output of each of internal scan chains 112, 114, 116, and 118 is compressed through a compactor 120 before being unloaded into MISR 122. MISR 122 generates a unique signature representing the responses from internal scan chains 112, 114, 116, and 118.

In addition to the loading and unloading of internal scan chains 112, 114, 116, and 118, each operation of a test program requires timed application of system clocks to launch the test data from LFSR 104, to issue control signals to execute operations on the test patterns within core logic 108, and to capture the resulting responses in MISR 122. Processor 100 may include multiple system clocks and various path delays, therefore the clock test sequence and timing set-up for running test patterns may be applied multiple times with different clock combinations and timings. An LBIST test program may include a relatively large number of operations to execute following the system clock cycles. At the end of an LBIST test program, LBIST controller 102 activates a done bit and the contents of MISR 122 are unloaded and compared with an expected signature. In one example, LBIST controller 102 compares the contents of MISR 122 with an expected signature. In another example, an external tester reads the contents of MISR 122 directly, or from LBIST controller 102, and compares the contents of MISR 122 with an expected signature. In one example, expected signatures are derived from simulation. Signatures that are derived by acquiring the same signature from multiple processor chips are referred to as a golden signature.

In the example, the done signal from LBIST controller 102 is activated when a test program has completed and the output from MISR 122 provides the data results from LBIST controller 102 running a test program on core logic 108. The results in MISR 122 alone, however, do not indicate what operations were actually executed on core logic 108 during testing. In addition, although in the case when MISR 122 ends with a non-zero result, the non-zero result may indicate that at least one scan cycle operation was executed on core logic 108, the non-zero result in MISR 122 still does not indicate whether other types of operations, other than scan cycle operations, were performed or not performed.

The LBIST structure of processor 100 includes an LBIST monitor 110 that tracks, on-chip, which types of operations were actually performed on core logic 108 during testing and LBIST monitor 110 reports which types of operations were actually performed when the test program is done. LBIST monitor 110 may include multiple types of gates, latches, and other logic units that read one or more control signals output by LBIST controller 102 to control execution of operations for a test program and that detect the types of operations performed on LBIST from the control signals.

In the example, LBIST monitor 110 includes a RESET_B signal that may be activated, prior to enabling an LBIST test, to clear any values from LBIST monitor 110. In the example, LBIST monitor 110 reads the LBIST_enable signal to detect when processor 100 is operating in a testing mode. In the example, LBIST monitor 110 reads the LBIST_start signal to detect when LBIST testing is active. When both the LBIST_enable signal and the LBIST_start signal are active signals, LBIST monitor 110 reads inputs from the operational signals for controlling core logic 108.

In the example, examples of control signals output by LBIST controller 102 for directing core logic 108 to execute the operations in a test program are illustrated as an SG signal, a THOLD_B signal, an NSL_THOLD_B signal, and an FCE signal. In the example, the SG signal represents a scan enable signal for scannable latches, the THOLD_B signal represents a clock hold signal for scannable latches with a negative active signal assumed, the NSL_THOLD_B signal represents a clock hold signal for non-scannable latches with a negative active signal assumed, and the FCE signal represents a force update for non-scannable latches. In the example, the SG signal, FCE signal, THOLD_B signal, and NSL_THOLD_B signal are toggled in the LBIST test program to execute an LBIST test program, where the basic LBIST test program consists of channel fill scan cycles, scan latch functional cycles, non-scan (NSL) fill cycles, and non-scan (NSL) functional cycles. In other examples, LBIST controller 102 may output additional or alternate types of operational signals.

In the example, if LBIST monitor 110 reads a combination of an active SG signal and an inactive THOLD_B signal, LBIST monitor 110 detects a channel fill scan cycle execution occurred. If LBIST monitor 110 reads a combination of an inactive SG signal and an inactive THOLD_B signal, LBIST monitor 110 detects a scan latch functional cycle execution occurred. If LBIST monitor 110 reads a combination of an active FCE signal and an inactive NSL_THOLD_B signal, LBIST monitor 110 detects an NSL fill cycle execution occurred. If LBIST monitor 110 reads a combination of an inactive FCE signal and an inactive NSL_THOLD_B signal, LBIST monitor 110 detects an NSL functional cycle execution.

In one example, LBIST monitor 110 may implement a simple latch for each type of operation monitored, where each latch is activated if the type of operation associated with the latch is read from a combination of control signals. When the test program is done, a tester needs only to read the output of each latch to detect the types of operations actually executed for a test program. By implementing simple latches that reflect whether or not each type of operation is detected, LBIST monitor 110 uses relatively little circuitry to detect, on-chip, which operations were actually executed during an LBIST test.

In another example, LBIST monitor 110 may include more complex circuitry that tracks the types of operations executed for a test program and additional information about when the operations executed. For example, LBIST monitor 110 may include more complex circuitry that stores the clock cycle when a first operation of a particular type is executed. In another example, LBIST monitor 110 may include more complex circuitry that stores all the clock cycles associated with a particular type of operation, where the clock cycle provides additional information for locating a particular operation or for determining the number of times an operation executed in a sequence.

In the example, the internal at-speed control signals for controlling core logic 108 are output at such high frequencies that these signals are not observable by an external component during testing. LBIST monitor 110, however, is located on-chip with core logic 108 and is able to read the internal at-speed control signals at any speed and quickly identify, based on the control signals, whether a particular type of operation has occurred during execution of a test program. LBIST monitor 110 uses a latch structure on-chip to detect the type of operations executed for a test pattern, concurrent with the test executing on-chip. LBIST monitor 110 uses the latch structure with a separate latch for each particular type of operation that is only set once when the particular type of operation is detected, such that LBIST monitor 110 can provide a single bit output for each type of operation, when a test program has completed execution, to indicate whether the type of operation occurred. LBIST monitor 110 condenses significant amounts of data output in each of the control signals while a test program is executing, into a single output for the test pattern of a multiple bit value indicating whether each type of operation executed from among the types of operations tracked.

If an LBIST structure does not include LBIST monitor 110, a tester may still determine which operations are executed for a test pattern during an LBIST test, but the tester is limited to using an external LBIST simulator to simulate the test patterns generated by LFSR 104 for a test program and to using the external LBIST simulator to view and analyze an event trace output by the processor to ensure that the appropriate sequences of operations occurred. The event trace, however, includes all the control signals monitored continuously on a chip during the test, yielding a large amount of data that must be stored and analyzed by the external LBIST simulator. In particular, in analyzing the event trace to detect which types of operations occurred, the external LBIST simulator must analyze each control signal at each clock cycle to detect whether the signal reached a voltage indicating an active or inactive signal and then align each active and inactive signals at each clock cycle to determine what operation is indicated by the signals. Thus, external LBIST simulation and analysis of an event trace, for a large multicore or system on a chip design, can take multiple days on a workstation or many hours on a hardware simulation platform. Therefore, while the use of an external LBIST simulator and the analysis of an event trace is an alternative method to determine the actual types of operations performed when core logic executes an LBIST test program, an LBIST simulator consumes a significant amount of time and resources. LBIST monitor 110, in contrast to an external LBIST simulator, requires a minimal amount of logic space on-chip to track the control signals output during a test program, concurrent with the execution of the test program, to identify which types of operations were actually executed during the execution of a test program. In one example, an external LBIST simulator may be modified to simulate the components of an LBIST, but still activate LBIST monitor 110 and read the outputs of LBIST monitor 110, instead of reading an event trace, to simplify the amount of data handled by the external LBIST simulator.

Figure 2:
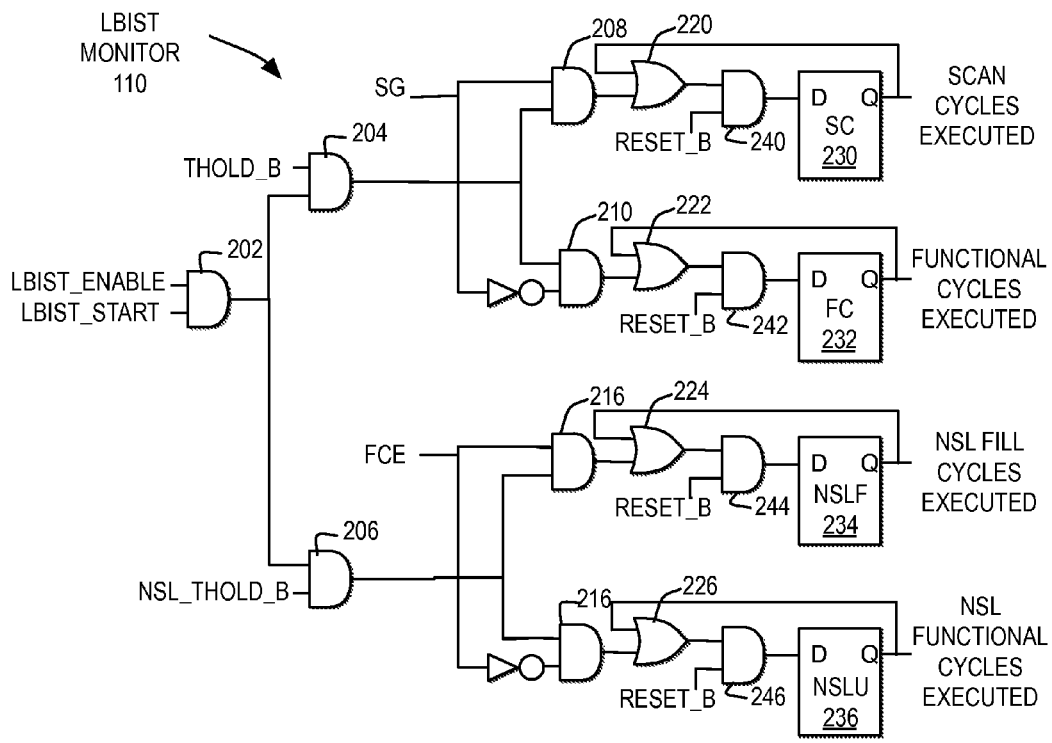
FIG. 2 illustrates a block diagram of one example of logical units of an on-chip LBIST monitor.

FIG. 2 illustrates a block diagram of one example of logical units of an on-chip LBIST monitor.

In the example, LBIST monitor 110 includes multiple logic units coupled for detecting the types of operations actually executed on core logic 108 for a test program, concurrent with the execution of the test program on core logic 108, and for outputting indicators of which types of operations actually executed on core logic 108 when the test program is done, concurrent with output of the signature value in MISR 122. In the example, a SC latch 230 outputs a bit indicating whether any scan cycles were detected, a FC latch 232 outputs a bit indicating whether any functional cycles were detected, an NSLF latch 234 outputs a bit indicating whether any non-scan fill cycles were detected, and an NSLU functional latch 236 outputs a bit indicating whether any non-scan functional cycles were detected. In other examples, LBIST monitor 110 may include additional or alternate latches for outputting bits indicating whether additional or alternate types of operations were detected.

In the example, LBIST monitor 110 reads the RESET_B signal. As illustrated, the RESET_B signal is read by each of AND gates 240, 242, 244, and 246. In the example, RESET_B is a negative active signal, therefore, when the signal is set to a high signal, or a digital 0, the values in SC latch 230, FC latch 232, NSLF latch 234, and NSLU latch 236 are all reset to a 0 bit and when RESET_B is set to an active-low signal, or digital 1, each of the latches can be set if another active signal reaches the latch.

In the example, AND gate 202 reads each of the LBIST_enable signal and the LBIST_start signal. When both LBIST_enable and LBIST_start are active, AND gate 202 outputs an active signal to AND gates 204 and 206. In the example, once AND gate 202 outputs an active signal, the control signals filter through the gates to set one or more latches. In the example, if the THOLD_B signal is an active-low, or a digital 1, and the SG signal is an active-high, or a digital 1, then AND gate 208 outputs an active signal to OR gate 220, OR gate 220 outputs an active signal to AND gate 240, and AND gate 240 outputs an active signal to SC 230, setting the output pin of SC 230, to indicate that a scan cycle is detected. In the example, if the THOLD_B signal is an active-low, or a digital 1, and the SG signal is inactive, or a digital 0, inverted, to an active signal, then AND gate 210 outputs an active signal to OR gate 222, OR gate 222 outputs an active signal to AND gate 242, and AND gate 242 outputs an active signal to FC latch 232, setting the output pin of FC latch 232, to indicate that a functional cycle is detected. In the example, if the NSL_THOLD_B signal is an active-low, or a digital 1, and FCE is an active-high, or a digital 1, then AND gate 214 outputs an active signal to OR gate 224, OR gate 224 outputs an active signal to AND gate 244, and AND gate 244 outputs an active signal to NSFL latch 234, setting the output pin of NSFL latch 234, to indicate that a non-scan fill cycle is detected. In the example, if the NSL_THOLD_B signal is an active-low, or a digital 1, and FCE is low, or a digital 0, then AND gate 216 outputs an active signal to OR gate 226, OR gate 226 outputs an active signal to AND gate 246, and AND gate 246 outputs an active signal to NSLU latch 236, setting the output pin of NSFL latch 234 to indicate that a non-scan functional cycle is detected.

The logic units illustrated in FIG. 2 for LBIST monitor 110 are non-intrusive and may be positioned anywhere in processor 100. In one example, the logic units of LBIST monitor 110 are positioned to minimize the impact of the additional logic units on-chip, within spaces not needed for operational components. In addition, the logic units for LBIST monitor 110 may be positioned on the edge of the chip so that SC latch 230, FC latch 232, NSLF latch 234, and NSLU latch 236 are positioned close to the boundary for the chip, minimizing latencies for reading the outputs from the latches. In addition, processor 100 may include multiple processor cores or core logic structures, each monitored by a single LBIST monitor with additional logic units or each monitored by a different LBIST monitor, where the logic units for each LBIST monitor are positioned close to the boundary of the chip, but proximate to the processor core being monitored, to minimize additional routing of the operational signals from each processor core to the LBIST monitor for the processor core. In additional or alternate embodiments, LBIST monitor 110 may include additional logic units for tracking clock signals and other signals during the execution of a test program by an LBIST.

The logic units illustrated in FIG. 2 are illustrative of one example of logic units which may be implemented to monitor control signals output by LBIST controller 102 and to detect, from the monitored control signals, one or more types of operations executed by LBIST controller 102 for a test program. In additional or alternate embodiments, additional or alternate types of controls signals may be monitored and additional or alternate types of operations may be detected.

Figure 3:
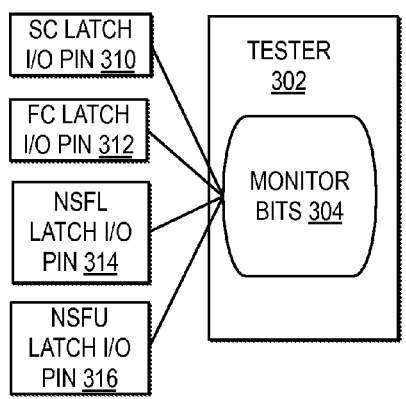
FIG. 3 illustrates a block diagram of one example of a tester for reading the types of operations detected by the LBIST monitor directly from the output pins of the latches of the LBIST monitor.

FIG. 3 illustrates a block diagram of one example of a tester for reading the types of operations detected by the LBIST monitor directly from the output pins of the latches of the LBIST monitor. In the example, each of SC latch 230, FC latch 232, NSFL latch 234, and NSLU latch 236 routes outputs through a separate I/O pin, illustrated in the example as SC latch I/O pin 310, FC latch I/O pin 312, NSFL latch I/O pin 314, and NSFU latch I/O pin 316. In the example, tester 302 reads outputs directly from SC latch I/O pin 310, FC latch I/O pin 312, NSFL latch I/O pin 314, and NSFU latch I/O pin, identifying the types of operations detected by LBIST monitor 110, and stores the bits read from each of the I/O pins as monitor bits 304. In particular, tester 302 reads the bits from each of SC latch I/O pin 310, FC latch I/O pin 312, NSFL latch I/O pin 314, and NSFU latch I/O pin 316 when tester 302 detects LBIST controller 102 activates the DONE signal.

In one example, tester 302 represents a tester implemented within automated test equipment (ATE), enabled to read input/output pins of processor 100. In the example, tester 302 automatically reads and analyzes the bits output from each of SC latch I/O pin 310, FC latch I/O pin 312, NSFL latch I/O pin 314, and NSFU latch I/O pin 316 to determine whether the types of operations executed for a test program match the expected types of operations for the test program.

Figure 4:
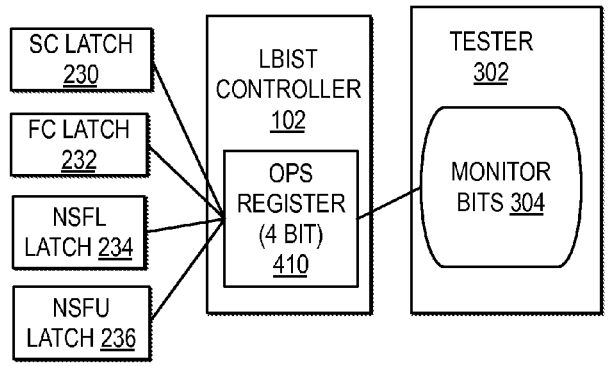
FIG. 4 illustrates a block diagram of one example of a tester for reading the types of operations detected by the LBIST monitor from registers in the LBIST controller.

FIG. 4 illustrates a block diagram of one example of a tester for reading the types of operations detected by the LBIST monitor from registers in the LBIST controller. In the example, when LBIST controller 102 completes execution of a test program, LBIST controller 102 loads the outputs from each of SC latch 230, FC latch 232, NSFL latch 234, and NSLU latch 236, identifying the types of operations detected by LBIST monitor 110, into registers of LBIST controller 102, illustrated in the example as operations (OPS) register 410, illustrated as a 4-bit register. In the example, tester 302 reads outputs from LBIST controller 102, and in particular, reads the bits specifying the types of operations detected by LBIST monitor 110, from OPS register 410, and stores the bits read from OPS register 410 as monitor bits 304.

In one example, tester 302 represents a tester implemented within a system functional operation environment that reads from registers of LBIST controller 102. In one example, tester 302 reads monitor bits 304 and analyzes the bits to determine whether the types of operations executed for a test program match the expected types of operations for the test program.

In another example, LBIST controller 102 may include additional logic, such as a comparator 412, that can be loaded with an expected bit pattern representing the expected types of operations for a test program, and LBIST controller 102 may compare OPS register 410 with the expected bit pattern to determine whether the types of operations executed for a test program match the expected types of operations for the test program.

Figure 5:
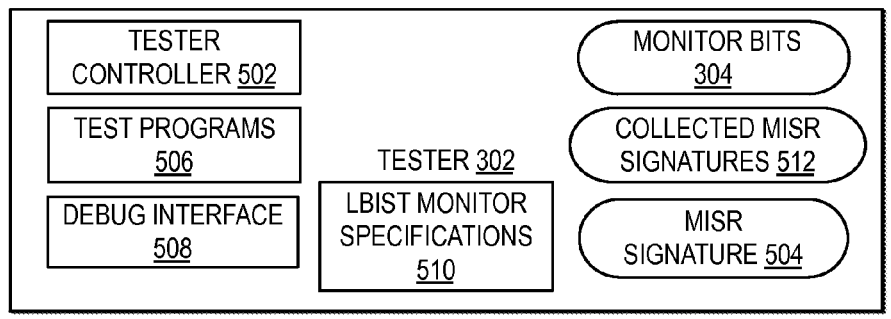
FIG. 5 illustrates a block diagram of one example of components of a tester for reading outputs from an LBIST controller including an LBIST monitor.

FIG. 5 illustrates a block diagram of one example of components of a tester for reading outputs from an LBIST controller including an LBIST monitor. In one example, tester 302 may be implemented through software, hardware, or a combination of software and hardware and may be implemented on-chip for processor 100, external to processor 100, or distributed both on-chip and external to processor 100. Tester 302 may include additional or alternate components the components illustrated.

In the example, tester 302 includes a tester controller 502 for controlling the functions of tester 302, test programs 506 including one or more test programs to run on an LBIST controller, a debug interface 508 through which test programs 506 can be debugged, and LBIST monitor specifications 510 that specify the type of operation associated with each bit position of the output of LBIST monitor 110.

In the example, tester controller 502 activates a RESET_B signal to reset LBIST monitor 110 before an LBIST mode is enabled. Tester controller 502 also activates the LBIST_enable signal to set a processor to LBIST testing mode and activates the LBIST_start signal for a particular test program from among test programs 506 to trigger LBIST controller 302 to run the particular test program. Tester controller 502 waits for LBIST controller 302 to active a DONE signal, indicating the particular test program is done executing. Once LBIST controller 302 activates a DONE signal, tester controller 502 deactivates the LBIST_start signal and LBIST_enable signal. Tester 302 reads MISR signature 504 comprising the value in MISR 122 and reads the monitor results 304 comprising the bits set in the latches in LBIST monitor 110 indicating the types of operations detected by LBIST monitor 110 during execution of the particular test program.

Tester 302 decodes, using LBIST monitor specification 510, which type of operation is assigned to each bit within monitor bits 304. Different LBIST monitors may monitor for different types of operations and different LBIST monitors may have different output configurations of bits.

Tester 302 compares monitor bits 304, as decoded according to LBIST monitor specifications 510, with at least one expected operation type for the test program. If the monitor bits 304 do not match with the at least one expected operation type for the test program, either because an operation type is detected in monitor bits 304 that was not expected or because an expected operation type is not detected in monitor bits 304, then tester triggers debug interface 508 and passes the unexpected operation issue through debug interface 508. In one example, a value representing the expected operation types for a test program is added to the test program or appended to the golden signature for a test program. In one example, debug interface 508 may also scan the test program and identify one or more of the types of operations that trigger execution of the unexpected operation type. A programmer or other user may debug the test program within debug interface 508 and select to update the debugged test program. In addition, a tester may request or debug interface 508 may automatically trigger a simulation of the test program to identify the particular portion of the test program sequence that triggered execution of unexpected operations. If debug interface 508 is not triggered or the test program is not modified, tester 302 sets an error flag for the test program.

In addition, tester 302 compares MISR signature 504 with an expected signature, also referred to as a golden signature. If MISR signature 504 does not match the golden signature, then tester 302 sets an error flag for the program. If monitor bits 304 match the expected at least one type of operation for a test program and MISR signature 504 matches the golden signature for the test program, then the program passes.

In one example, where a programmer is programming or modifying test programs on the fly in the lab environment, by tester 302 accessing both monitor bits 304 and MISR signature 504 for a test program, the programmer can verify that the test program modified on the fly actually runs the types of operations desired to be run without having to run a separate LBIST simulation. In a lab environment, a programmer may modify a test program slightly, to characterize a part in a new way and may inadvertently introduce types of operations into the test program without desiring to run the types of operations for the test program. By the programmer accessing monitor bits 304 while running tests, the programmer can quickly view when operations have been introduced into a test program that are not the desired operations for that test program.

In addition, in a lab environment, by tester 302 accessing both monitor bits 304 and MISR signature 504 for a test program, the programmer can select a golden signature for the test program and verify, based on monitor bits 304, that the golden signature is set for a test program that only includes the operations desired for the test program. In one example, to determine the golden signature for a test program, tester 302 may run a test program a particular number of times, setting the golden signature for the test program to the first MISR signature, and tracking the MISR signatures for each subsequent iteration of the test program in collected MISR signatures 512, along with confirming that monitor bits 304 match the at least one expected operation type for the test program for each iteration. After the test program is run the particular number of times, tester 302 may determine if a consistent MISR signature is generated for the test program from collected MISR signatures 512 and set the consistent MISR signature as the golden signature for the test program.

In another example, where a manufacturing technician is running test programs in a manufacturing environment, to test the operability of a processor, by tester 302 accessing both monitor bits 304 and MISR signature 504 for a test program, the manufacturing technician can verify that the types of operations that need to be tested on a processor during manufacture are the types of operations that are actually tested by the test programs provided to the manufacturing technician. In one example, a product designer may generate test programs for an integrated circuit and send the test programs to a manufacturer for running on the manufactured integrated circuit, where the test programs specify specific types of operations expected to be tested for each test program and a golden signature for each test program. Tester 302 detects whether the MISR signature output for each test program passes on manufactured processors, but also detects, whether the test programs run on the manufactured processes actually test the types of operations expected to be tested for each test program, allowing for more precise error detection and testing validation at the manufacturing level.

Figure 6:
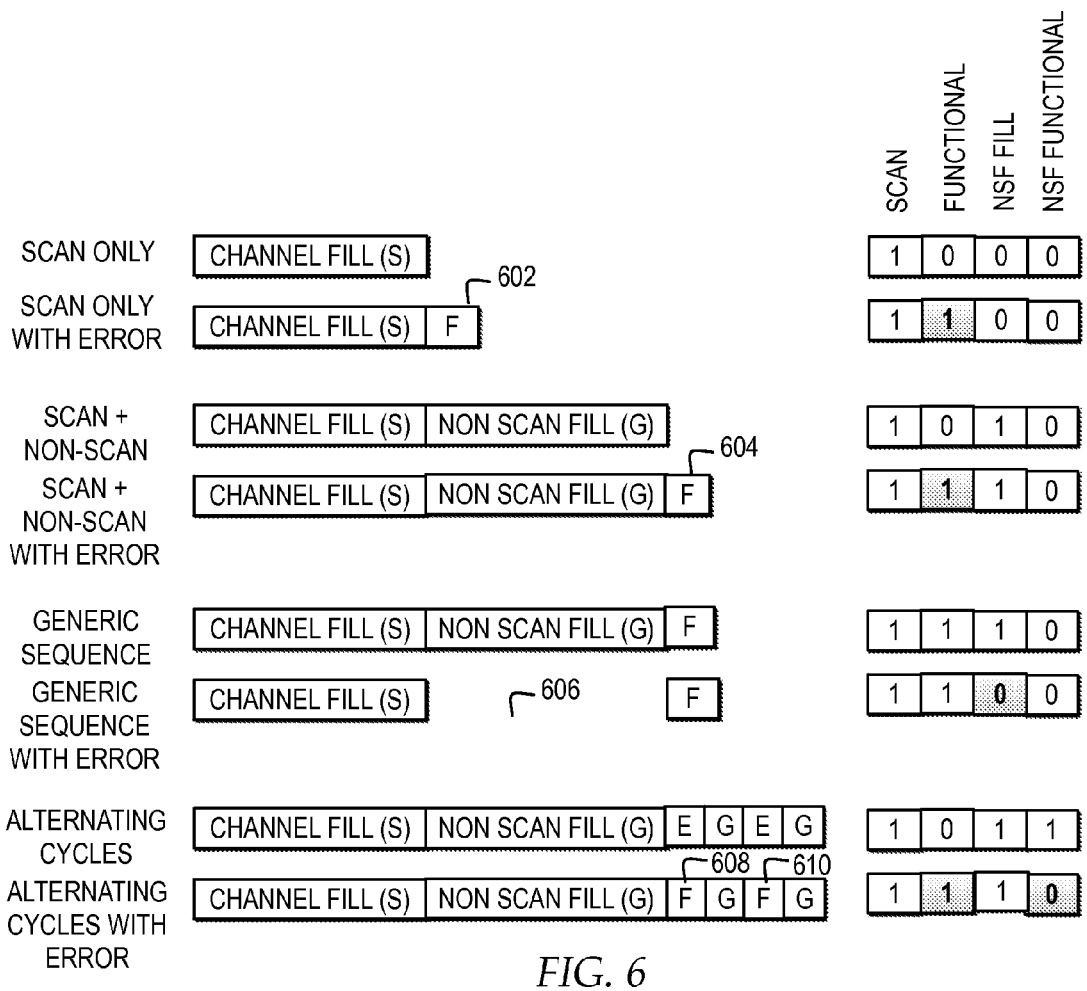
FIG. 6 illustrates a block diagram of examples of expected operation sequences in test programs compared with test programs with errors that yield unexpected operation sequences during actual execution of the LBIST test program.

FIG. 6 illustrates a block diagram of examples of expected operation sequences in test programs compared with test programs with errors that yield unexpected operation sequences during actual execution of the test program.

In a first example, a test program with an expected operation sequence of scan only operations runs and the LBIST monitor detects the types of operations actually executed in latches set to an output of "1000", where the "1" in first bit position indicates that a scan cycle operation ran and where the "000" indicate that no other type of operation ran, as expected. In comparison, a next test program with a same expected operation sequence of scan only operations runs, but there is an error in the test program and during execution, a functional cycle operation executes, as illustrated at reference numeral 602. The LBIST monitor detects the types of operations actually executed in latches set to an output of "1100", where the "1" in the first bit position indicates that a scan cycle operation ran, but where the "1" in the second bit position indicates that an unexpected functional operation also ran. For the test program marked "scan only with error", tester 302 compares an expected operation type output of "1000" to the actual output from LBIST monitor of "1100" and detects the unexpected functional operation ran during the test program contrary to the expectation of a scan only test program.

In a second example, a test program with an expected operation sequence of scan cycles and non-scan fill cycles runs and the LBIST monitor detects the types of operations actually executed in latches set to an output of "1010", where the "1" in the first bit position indicates that a scan cycle operation ran, where the "1" in the third bit position indicates that a non-scan fill cycle operation ran, and where the "0" in the second and fourth bit position indicates that no other types of operations ran, as expected. In comparison, a next test program with a same expected operation sequence of scan cycles and non-scan fill cycles runs, but there is an error in the test program and during execution, a functional cycle operation executes, as illustrated at reference numeral 604. The LBIST monitor detects the types of operations actually executed in latches set to an output of "1110", where the "1" in the first bit position and third bit position indicates that a scan cycle operation and a non-scan fill cycle operation both ran, but where the "1" in the second bit position indicates that an unexpected functional operation also ran. For the test program marked "scan+non-scan with error", tester 302 compares an expected operation type output of "1010" to the actual output from LBIST monitor of "1100" and detects the unexpected functional operation ran during the test program contrary to the expectation of a scan and non-scan fill test program.

In a third example, a test program with an expected operation sequence of a generic sequence of scan, non-scan fill, and functional cycles runs and the LBIST monitor detects the types of operations actually executed in latches set to an output of "1110", where the "1" in the first, second and third bit positions indicate that a scan cycle operation, functional cycle operation, and non-scan fill cycle operation all ran, as expected. In comparison, a next test program with a same expected generic operation sequence runs, but there is an error in the test program and during execution, no non-scan fill operation executes, as illustrated at reference numeral 606. The LBIST monitor detects the types of operations actually executed in latches set to an output of "1100", where the "1" in the first bit position and second bit position indicates that a scan cycle operation and a functional cycle operation both ran, but where the "0" in the third bit position indicates that unexpectedly, a non-scan fill operation did not run. For the test program marked "generic sequence with error", tester 302 compares an expected operation type output of "1110" to the actual output from LBIST monitor of "1100" and detects that unexpectedly, no non-scan fill operation ran during the test program contrary to the expectation of a generic sequence test program including a non-scan fill operation.

In a fourth example, a test program with an expected operation sequence of alternating cycles runs and the LBIST monitor detects the types of operations actually executed in latches set to an output of "1011", where the "1" in the first, third and fourth bit positions indicate that a scan cycle operation, non-scan fill cycle operation, and non-scan functional operation ran and where the "0" in the second bit position indicates that a functional cycle operation did not run, as expected. In comparison, a next test program with a same expected operation sequence of alternating cycles runs, but there is an error in the test program and during execution, a functional cycle operation executes, as illustrated at reference numerals 608 and 610, and no non-scan functional operations execute. The LBIST monitor detects the types of operations actually executed in latches set to an output of "1110", where the "1" in the first, second, and third bit positions indicate that a scan cycle operation, functional cycle operation, and non-scan fill cycle operation all ran, but where the "0" in the fourth bit position indicates that no non-scan functional cycle was executed. For the test program marked "alternating cycles with errors", tester 302 compares an expected operation type output of "1011" to the actual output from LBIST monitor of "1110" and detects the unexpected functional operation ran during the test program contrary to the expectation an alternating cycles test program and detects that no non-scan functional operation ran during the test program contrary to the expectation of an alternating cycles test program including a non-scan functional operation.

Figure 7:
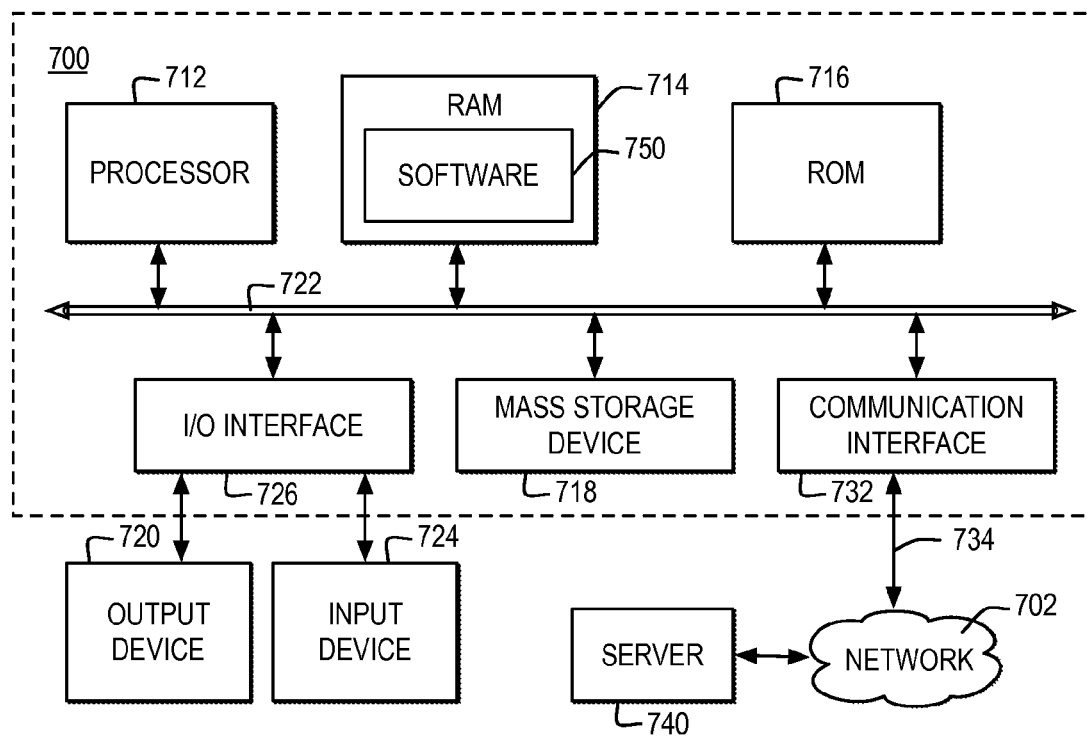
FIG. 7 illustrates one example of a schematic of a computer system in which the present invention may be implemented.

FIG. 7 illustrates one example of a schematic of a computer system in which the present invention may be implemented. The present invention may be performed in a variety of systems and combinations of systems, made up of functional components, such as the functional components described with reference to computer system 700 and may be communicatively connected to a network, such as network 702.

Computer system 700 includes a bus 722 or other communication device for communicating information within computer system 700, and at least one hardware processing device, such as processor 712, coupled to bus 722 for processing information. Bus 722 preferably includes low-latency and higher latency paths that are connected by bridges and adapters and controlled within computer system 700 by multiple bus controllers. When implemented as a server or node, computer system 700 may include multiple processors designed to improve network servicing power. Where multiple processors share bus 722, additional controllers (not depicted) for managing bus access and locks may be implemented. In one example, processor 712 and other processors implemented in computer system 700 may implement one or more of the components illustrated in processor 100 in FIG. 1.

Processor 712 may be at least one general-purpose processor such as IBM® PowerPC® (IBM and PowerPC are registered trademarks of International Business Machines Corporation) processor that, during normal operation, processes data under the control of software 750, which may include at least one of application software, an operating system, middleware, and other code and computer executable programs accessible from a dynamic storage device such as random access memory (RAM) 714, a static storage device such as Read Only Memory (ROM) 716, a data storage device, such as mass storage device 718, or other data storage medium. Software 750 may include, but is not limited to, code, applications, protocols, interfaces, and processes for controlling one or more systems within a network including, but not limited to, an adapter, a switch, a cluster system, and a grid environment.

Figure 8:
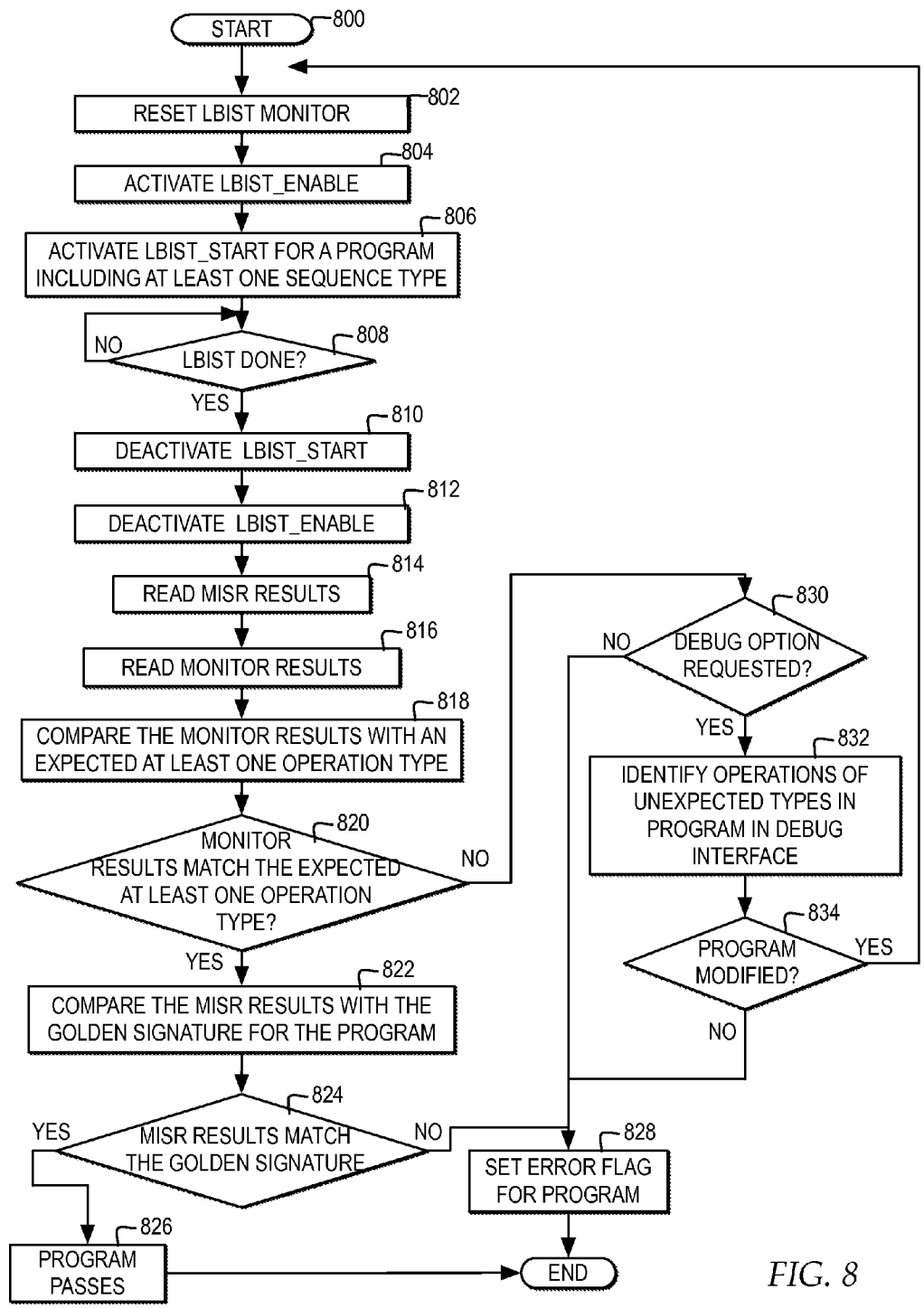
FIG. 8 illustrates a high level logic flowchart of a process and program for a tester for directing an LBIST controller with an LBIST monitor.
Figure 9:
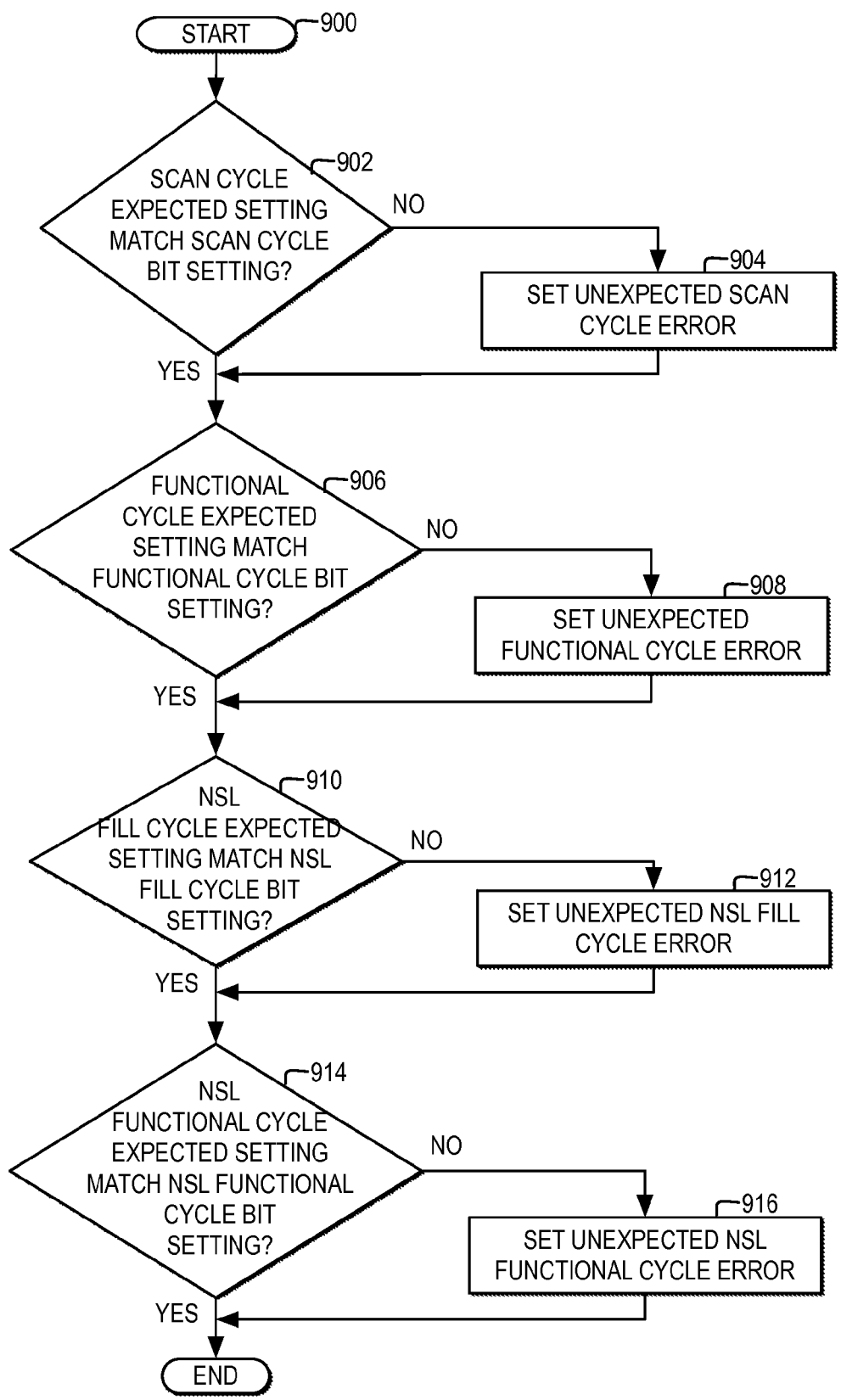
FIG. 9 illustrates a high level logic flowchart of a process and program for determining whether LBIST monitor results indicating the types operations detected during execution of a test program match the expected operation types for the test program.
Figure 10:
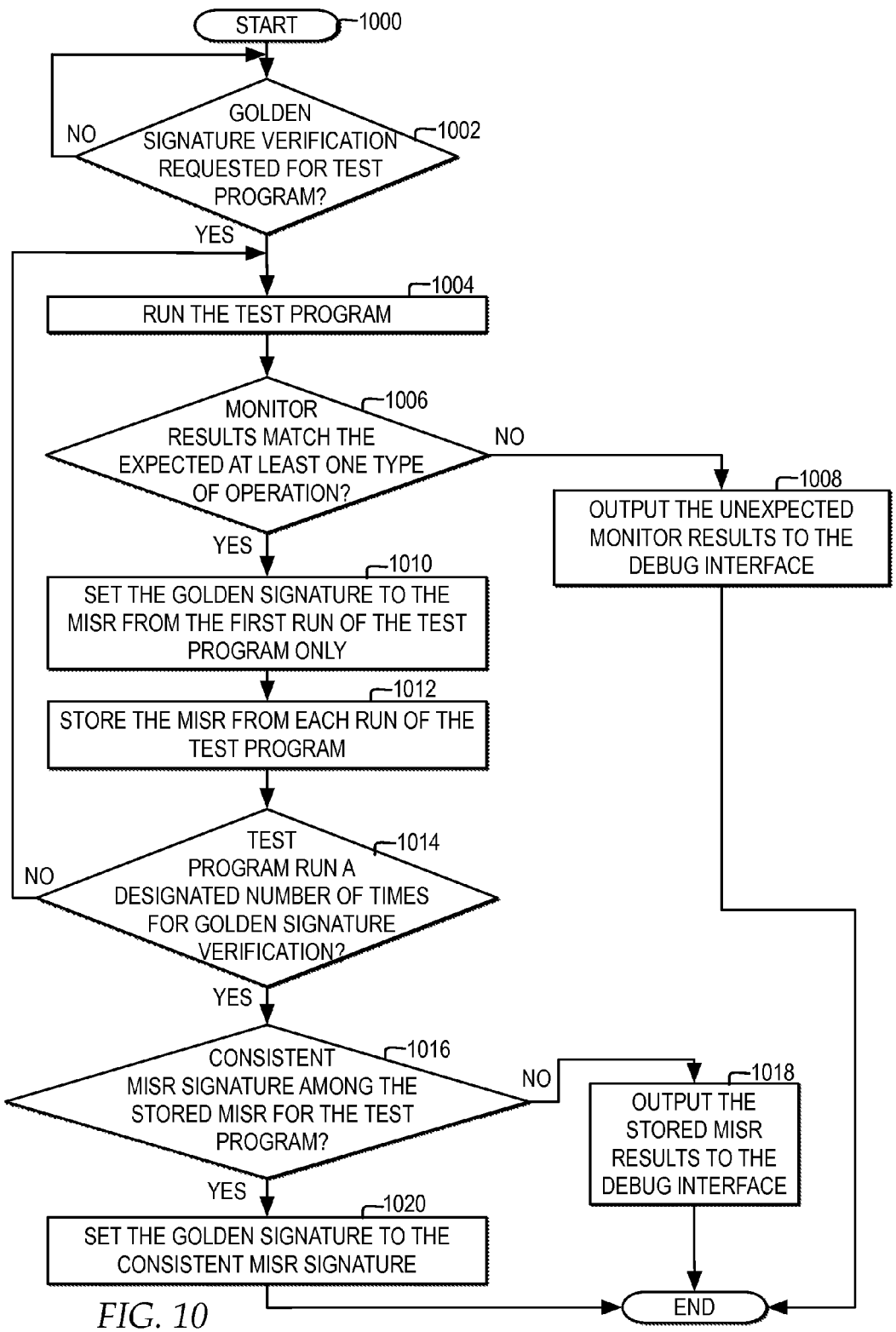
FIG. 10 illustrates a high level logic flowchart of a process and program for verifying a golden signature for a test program through an LBIST controller that includes an LBIST monitor.

In one embodiment, the operations performed by processor 712 may control the operations of flowchart of FIGS. 8, 9, and 10 and other operations described herein. Operations performed by processor 712 may be requested by software 750 or other code or the steps of one embodiment of the invention might be performed by specific hardware components that contain hardwired logic for performing the steps, or by any combination of programmed computer components and custom hardware components.

Those of ordinary skill in the art will appreciate that aspects of one embodiment of the invention may be embodied as a system, method or computer program product. Accordingly, aspects of one embodiment of the invention may take the form of an entirely hardware embodiment, an entirely software embodiment (including firmware, resident software, microcode, etc.) or an embodiment containing software and hardware aspects that may all generally be referred to herein as "circuit," "module," or "system." Furthermore, aspects of one embodiment of the invention may take the form of a computer program product embodied in one or more tangible computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, such as mass storage device 718, a random access memory (RAM), such as RAM 714, a read-only memory (ROM) 716, an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction executing system, apparatus, or device.

A computer readable signal medium may include a propagated data signal with the computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction executable system, apparatus, or device.

Program code embodied on a computer readable medium may be transmitted using any appropriate medium, including but not limited to, wireless, wireline, optical fiber cable, radio frequency (RF), etc., or any suitable combination of the foregoing.

Computer program code for carrying out operations of on embodiment of the invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, such as computer system 700, partly on the user's computer, as a stand-alone software package, partly on the user's computer and partly on a remote computer or entirely on the remote computer or server. In the latter scenario, the remote computer may be connected to the user's computer through any type of network, such as network 702, through a communication interface, such as network interface 532, over a network link that may be connected, for example, to network 702.

In the example, network interface 732 includes an adapter 734 for connecting computer system 700 to network 702 through a link. Although not depicted, network interface 732 may include additional software, such as device drivers, additional hardware and other controllers that enable communication. When implemented as a server, computer system 700 may include multiple communication interfaces accessible via multiple peripheral component interconnect (PCI) bus bridges connected to an input/output controller, for example. In this manner, computer system 700 allows connections to multiple clients via multiple separate ports and each port may also support multiple connections to multiple clients.

One embodiment of the invention is described below with reference to flowchart illustrations and/or block diagrams of methods, apparatus (systems) and computer program products according to embodiments of the invention. Those of ordinary skill in the art will appreciate that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, such as computer system 700, or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer, such as computer system 700, or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Network interface 732, the network link to network 702, and network 702 may use electrical, electromagnetic, or optical signals that carry digital data streams. The signals through the various networks and the signals on network 702, the network link to network 702, and network interface 732 which carry the digital data to and from computer system 700, may be forms of carrier waves transporting the information.

In addition, computer system 700 may include multiple peripheral components that facilitate input and output. These peripheral components are connected to multiple controllers, adapters, and expansion slots, such as input/output (I/O) interface 726, coupled to one of the multiple levels of bus 722. For example, input device 724 may include, for example, a microphone, a video capture device, an image scanning system, a keyboard, a mouse, or other input peripheral device, communicatively enabled on bus 722 via I/O interface 726 controlling inputs. In addition, for example, output device 720 communicatively enabled on bus 722 via I/O interface 726 for controlling outputs may include, for example, one or more graphical display devices, audio speakers, and tactile detectable output interfaces, but may also include other output interfaces. In alternate embodiments of the present invention, additional or alternate input and output peripheral components may be added.

Those of ordinary skill in the art will appreciate that the hardware depicted in FIG. 7 may vary. Furthermore, those of ordinary skill in the art will appreciate that the depicted example is not meant to imply architectural limitations with respect to the present invention.

FIG. 8 illustrates a high level logic flowchart of a process and program for a tester for directing an LBIST with an LBIST monitor. In the example, the process starts at block 800 and thereafter proceeds to block 802. Block 802 illustrates setting the reset input for the LBIST monitor. Next, block 804 illustrates activating the LBIST_enable input. Thereafter, block 806 illustrates activating the LBIST_start input for a program including at least one sequence type. Next, block 808 illustrates the tester monitoring for the LBIST to be done processing the program. In one example, the tester detects the LBIST_done output from the LBIST controller and detects that the LBIST is done processing the program. In another example, the tester may wait for a period of time equal to the expected runtime of the program and detect that the LBIST is done processing the program when the expected runtime expires. When the tester detects the LBIST is done processing the program, then the process passes to block 810.

Block 810 illustrates deactivating the LBIST_start input. Next, block 812 illustrates deactivating the LBIST_enable input. Thereafter, block 814 illustrates reading the MISR results. Next, block 816 illustrates reading the monitor results. Thereafter, block 818 illustrates the tester comparing the monitor results with an expected at least one sequence type. Next, block 820 illustrates a determination whether the monitor results match the expected at least one sequence type.

At block 820, if the tester detects that the monitor results do not match the expected at least one sequence type, then the process passes to block 830. Block 830 illustrates a determination whether a debug option is selected. At block 830, if a debug option is not selected, then the process ends. At block 830, if a debug option is selected, then the process passes to block 832. Block 832 illustrates identifying the sequences of unexpected types in the program in the debug interface. Next, block 834 illustrates a determination whether the program is modified in the debug interface. At block 834, if the program is modified in the debug interface, then the process returns to block 802. At block 834, if the program is not modified in the debug interface, then the process passes to block 828. Block 828 illustrates setting an error flag for the program, and the process ends.

Returning to block 820, if the tester detects that the monitor results do match the expected at least one sequence type, then the process passes to block 822. Block 822 illustrates comparing the MISR results with the golden signature for the program. Next, block 824 illustrates a determination whether the MISR results match the golden signature. At block 824, if the MISR results match the golden signature, then the process passes to block 826. Block 826 illustrates indicating the program passes, and the process ends. At block 824, if the MISR results do not match the golden signature, then the process passes to block 828, an error flag is set for the program, and the process ends.

FIG. 9 illustrates a high level logic flowchart of a process and program for determining whether LBIST monitor results indicating the types operations detected during execution of a test program match the expected operation types for the test program. In the example, the process starts at block 900 and thereafter proceeds to block 902.

Block 902 illustrates a determination whether a scan cycle expected setting for a program matches a scan cycle bit setting from the LBIST monitor. At block 902, if the scan cycle expected setting does not match the scan cycle bit setting, then the process passes to block 904. Block 904 illustrates setting an unexpected scan cycle error indicating whether an unexpected scan cycle was present or whether a scan cycle was expected but not present, and the process passes to block 906. At block 902, if the scan cycle expected setting matches the scan cycle bit setting, then the process passes to block 906.

Block 906 illustrates a determination whether a functional cycle expected setting for a program matches a functional cycle bit setting from the LBIST monitor. At block 906, if the functional cycle expected setting does not match the functional cycle bit setting, then the process passes to block 908. Block 908 illustrates setting an unexpected functional cycle error indicating whether an unexpected functional cycle was present or whether a functional cycle was expected but not present, and the process passes to block 910. At block 906, if the functional cycle expected setting matches the functional cycle bit setting, then the process passes to block 910.

Block 910 illustrates a determination whether an NSL fill cycle expected setting for a program matches an NSL fill cycle bit setting from the LBIST monitor. At block 910, if the NSL fill cycle expected setting does not match the NSL fill bit setting, then the process passes to block 912. Block 912 illustrates setting an unexpected NSL fill cycle error indicating whether an unexpected NSL fill cycle was present or whether an NSL fill cycle was expected but not present, and the process passes to block 914. At block 910, if the NSL fill cycle expected setting matches the NSL fill cycle bit setting, then the process passes to block 914.

Block 914 illustrates a determination whether an NSL functional cycle expected setting for a program matches an NSL functional cycle bit setting from the LBIST monitor. At block 914, if the NSL functional cycle expected setting does not match the NSL functional bit setting, then the process passes to block 916. Block 916 illustrates setting an unexpected NSL functional cycle error indicating whether an unexpected NSL functional cycle was present or whether an NSL functional cycle was expected but not present, and the process ends. At block 914, if the NSL functional cycle expected setting matches the NSL functional cycle bit setting, then the process ends.

FIG. 10 illustrates a high level logic flowchart of a process and program for verifying a golden signature for a test program through an LBIST that includes an LBIST monitor. In the example, the process starts at block 1000 and thereafter proceeds to block 1002. Block 1002 illustrates a determination whether golden signature verification is requested for a test program. If golden signature verification is requested for a test program, then the process passes to block 1004. Block 1004 illustrates running the test program, starting at block 802 of FIG. 8. Block 1006 illustrates, when the test program has finished running and monitor results are returned, a determination whether the monitor results match the expected at least one type of operation for the test program.

At block 1006, if the monitor results do not match the expected at least one type of operation, then the process passes to block 1008. Block 1008 illustrates outputting the unexpected monitor results to the debug interface, and the process ends. By ending the golden signature verification program if the monitor results do not match the expected at least one type of operation, a golden signature is only set from MISR results from a MISR that results from running only the expected types of operations for test program.

At block 1006, if the monitor results match the expected at least one type of operation, then the process passes to block 1010. Block 1010 depicts setting the golden signature to the MISR from the first run of the test program only. Next, block 1012 illustrates storing the MISR from each run of the test program. Thereafter, block 1014 illustrates a determination whether a test program has run a designated number of times for golden signature verification. At block 1014, if the test program has not run a designated number of times for golden signature verification, then the process returns to block 1004.

At block 1014, if the test program has run a designated number of times for golden signature verification, then the process passes to block 1016.

Block 1016 illustrates a determination whether there is a consistent MISR signature among the stored MISR for the test program, where a consistent MISR signature among the stored MISR is one that is repeated at least a threshold number of times from among the designated number of times the test program runs for golden signature verification. At block 1016, if there is not a consistent MISR signature among the stored MISR for the test program, then the process passes to block 1018. Block 1018 illustrates outputting the stored MISR results to the debug interface, and the process ends. At block 1016, if there is a consistent MISR signature among the stored MISR for the test program, then the process passes to block 1020. Block 1020 illustrates setting the golden signature to the consistent MISR signature, and the process ends.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, occur substantially concurrently, or the blocks may sometimes occur in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification specify the presence of stated features, integers, steps, operations, elements, and/or components, but not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the one or more embodiments of the invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the invention has been particularly shown and described with reference to one or more embodiments, it will be understood by those skilled in the art that various changes in form and detail may be made therein without departing from the spirit and scope of the invention.

What is claimed is:

1. An integrated circuit comprising:
    a Logic Built-in Self-Test (LBIST) structure operative to run a test program on at least one selection of core logic of the integrated circuit to test the operability of the at least one selection of core logic, the LBIST structure positioned on chip with the at least one selection of core logic, the test program specifying at least one operation for the LBIST structure to run on at least one test pattern through the at least one selection of core logic, the at least one operation comprising at least one type of operation of a plurality of types of operations;
    the LBIST structure operative to control the at least one type of operation of the plurality of types of operations performed on the at least one selection of core logic, while running the at least one operation of the test program, by activating at least one control signal of a plurality of control signals received as inputs to the at least one selection of core logic, wherein one or more control signals of the plurality of control signals is associated with each type of operation of the plurality of types of operations; and
    the LBIST structure comprising a monitoring logic structure operative to detect the at least one type of operation actually performed on the at least one selection of core logic while the test program is running by monitoring the at least one control signal of the plurality of control signals activated by the LBIST structure while the LBIST structure runs the test program.

2. The integrated circuit according to claim 1 further comprising:
    the at least one selection of core logic comprising a plurality of scan chains;
    the test program specifying the at least one type of operation for the LBIST structure to run on the at least one test pattern through the plurality of scan chains;
    the LBIST structure operative to trigger a linear feedback shift register (LFSR) to generate the test pattern, pass the test pattern through a phase shifter, and load the test pattern into the plurality of scan chains;
    the LBIST structure operative to control a timed application of a system clock to pass the test pattern through the phase shifter and activate the at least one control signal to run the at least one type of operation on the test pattern within the at least one selection of control logic;
    the LBIST structure operative to unload at least one result of running the at least one type of operation on the test pattern from the plurality of scan chains in a multiple input shift register (MISR), wherein an output from the MISR reflects a data result from LBIST structure running the test program on the at least one selection of core logic; and
    the monitoring logic structure operative to monitor the plurality of control signals through a plurality of logic units, where each logic unit of the plurality of logic units receives inputs of one or more of the plurality of control signals, where each logic units of the plurality of logic units detects a separate type of operation of the plurality of types of operations, wherein an output from the plurality of logic units reflects the at least one type of operation actually performed for the test program.

3. The integrated circuit according to claim 1, further comprising:
    the monitoring logic structure operative to monitor the at least one control signal of the plurality of control signals comprising a scan enable for scannable latches signal, a force update for non-scannable latches signal, a clock hold signal for scannable latches, and a clock hold signal for non-scannable latches.

4. The integrated circuit according to claim 1, further comprising:
   the monitoring logic structure operative to detect the at least one type of operation:
   when a first control signal of the plurality of control signals is activated and a second control signal of the plurality of control signals is activated, detect the at least one type of operation comprising a scan cycle operation, wherein the first control signal is activated for scan enable for scannable latches, wherein the second control signal is activated for a clock hold signal for scannable latches;
   when the first control signal is not activated and the second control signal is activated, detect the at least one type of operation comprising a functional cycle operation;
   when a third control signal of the plurality of control signals is activated and a fourth control signal of the plurality of control signals is activated, detect the at least one type of operation comprising a non-scan fill cycle operation, wherein the third control signal is activated for a force update for non-scannable latches, wherein the fourth control signal is activated for a clock hold signal for non-scannable latches; and
   when the third control signal is not activated and the fourth control signal is activated, detect the at least one type of operation comprising a non-scan functional cycle operation.

5. The integrated circuit according to claim 1, further comprising:
   the monitoring logic structure comprising a separate latch of a plurality of latches associated with each type of operation of the plurality of types of operations, wherein each of the plurality of latches is set in response to a separate selection of signal settings from among one or more of the plurality of control signals; and
   the monitoring logic structure operative, in response to monitoring the at least one control signal activated by the LBIST structure, to set a particular latch of the plurality of latches associated with the at least one-type of operation, wherein once the particular latch is set while the test program is run the particular latch remains set until the test program is done and the latch is reset.

6. The integrated circuit according to claim 5, further comprising:
   each separate latch operative to receive an input from a separate logic gate comprising an input from a reset signal, wherein when the reset signal is activated each separate latch is to-reset to a digital zero, wherein the reset signal is activated prior to execution of the test program.

7. The integrated circuit according to claim 1, further comprising:
   the monitoring logic structure operative to output a separate bit from among a plurality of bits for each type of operation of the plurality of type of operations indicating whether each type of operation of the plurality of types of operations was detected.

8. The integrated circuit according to claim 7, further comprising:
   the monitoring logic structure operative to output the separate bit from among the plurality of bits via a plurality of input/output pins readable by an external tester.

9. The integrated circuit according to claim 7, further comprising:
   the monitoring logic structure operative to output the separate bit from among the plurality of bits by loading the plurality of bits into a register of the LBIST structure, wherein the register is readable by an external tester.

10. The integrated circuit according to claim 1, further comprising:
    the monitoring logic structure comprising a first logic gate operative to detect whether an enable signal and a start signal for the LBIST structure are active; and
    the monitoring logic structure operative, in response to the first logic gate detecting the enable signal and the start signal for the LBIST structure are active, to enable monitoring of the at least one control signal.

* * * * *